United States Patent
Choi

(10) Patent No.: US 7,952,954 B2
(45) Date of Patent: May 31, 2011

(54) SEMICONDUCTOR INTEGRATED CIRCUIT FOR GENERATING ROW MAIN SIGNAL AND CONTROLLING METHOD THEREOF

(75) Inventor: Don-Hyun Choi, Ichon (KR)

(73) Assignee: Hynix Semiconductor Inc. (KR)

( * ) Notice: Subject to any disclaimer, the term of this patent is extended or adjusted under 35 U.S.C. 154(b) by 144 days.

(21) Appl. No.: 12/346,540

(22) Filed: Dec. 30, 2008

(65) Prior Publication Data

US 2009/0316504 A1   Dec. 24, 2009

(30) Foreign Application Priority Data

Jun. 24, 2008   (KR) .................. 10-2008-0059846

(51) Int. Cl.
*G11C 8/00*   (2006.01)
(52) U.S. Cl. ................. 365/230.06; 365/194; 365/233.1
(58) Field of Classification Search ............ 365/230.06, 365/233.1, 230.03, 191, 194
See application file for complete search history.

(56) References Cited

U.S. PATENT DOCUMENTS

| | | | |
|---|---|---|---|
| 7,064,991 B2 * | 6/2006 | Maeda | 365/201 |
| 7,158,427 B2 | 1/2007 | Park | |
| 7,321,991 B2 * | 1/2008 | An | 714/42 |
| 7,656,741 B2 * | 2/2010 | Lee et al. | 365/230.06 |
| 2005/0128833 A1 | 6/2005 | Jang | |
| 2005/0166097 A1 * | 7/2005 | An | 714/42 |

FOREIGN PATENT DOCUMENTS

KR   100190028 B1   1/1999
KR   1020050067449   7/2005

* cited by examiner

*Primary Examiner* — Gene N. Auduong
(74) *Attorney, Agent, or Firm* — Baker & McKenzie LLP

(57) ABSTRACT

A semiconductor integrated circuit includes a row main signal generation section configured to provide a row main signal serving as a driving reference for a plurality of row-series circuit units in response to a bank active signal, wherein activation timing of the row main signal is controlled by a test mode signal.

23 Claims, 4 Drawing Sheets

SEMICONDUCTOR INTEGRATED CIRCUIT FOR GENERATING ROW MAIN SIGNAL AND CONTROLLING METHOD THEREOF

CROSS-REFERENCES TO RELATED APPLICATION

The present application claims priority under 35 U.S.C. §119(a) to Korean application number 10-2008-0059846, filed on Jun. 24, 2008, in the Korean Intellectual Property Office, which is incorporated herein by reference in its entirety as set forth in full.

BACKGROUND

1. Technical Field

The embodiment described herein relates to a semiconductor integrated circuit, and more particularly, to a semiconductor integrated circuit which generates a row main signal.

2. Related Art

In general, a row signal path of a dynamic random access memory (DRAM) device receives a row address signal, a word line is selected, and cell data is amplified by a sense amplifier. a row main signal is generated in response to the row address signal and commonly controls row-series circuit units row-series, such as a sub-word line control unit, a sense amplifier control unit, and a bit line equalize control unit.

Since the sub-word line control unit, the sense amplifier control unit, and the bit line equalize control unit commonly receive the row main signal, if the activation timing of the row main signal is changed, the activation timing of the signals associated with these circuit units can also be commonly changed. Accordingly, by appropriately tuning the activation timing of the row main signal, specifications of a RAS to CAS delay time (tRCD) and a precharge to RAS time (tRP), which exist in a corresponding relationship, should meet each other.

However, the tuning of the activation timing of the row main signal is problematic since it requires tuning a delay time for generating a row main signal by opening or closing a switch made of a metal material that connects a plurality of delay elements. For example, when it is necessary to change a metal option so as to meet the specifications of the tRCD and the tRP, mask revisions are required, whereby production time and costs increase.

SUMMARY

A semiconductor integrated circuit capable of controlling the delay time of a row main signal using test mode signals is described herein.

In one aspect, a semiconductor integrated circuit includes a row main signal generation section configured to provide a row main signal serving as a driving reference for a plurality of row-series circuit units in response to a bank active signal, wherein activation timing of the row main signal is controlled by a test mode signal row-series In another aspect, a semiconductor integrated circuit includes a row main signal generation section configured to provide a row main signal for determining precharge and active timing margins in response to an active command, and a target circuit section connected to the row main signal generation section and configured to generate a signal with reference to activation timing of the row main signal, wherein the row main signal is tuned in its delay time depending upon a test mode signal.

In another aspect, a semiconductor integrated circuit provides a driving reference signal for a plurality of row-series circuit units in response to a bank active signal, and includes a first delay unit configured to receive and delay the bank active signal, a second delay unit configured to receive and delay an output signal of the first delay unit, a first transmission gate configured to transmit the output signal of the second delay unit in response to a test mode signal, a second transmission gate configured to transmit the output signal of the first delay unit in response to the test mode signal, and a signal combining unit configured to combine the bank active signal and the delayed bank active signal, and to provide the driving reference signal, wherein activation timing of the driving reference signal is controlled by the test mode signal.

In still another aspect, a method for generating a row main signal in a semiconductor integrated circuit comprises providing a row main signal serving as a driving reference for a plurality of row-series circuit units in response to a bank active signal, wherein the activation timing of the row main signal is controlled by a test mode signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
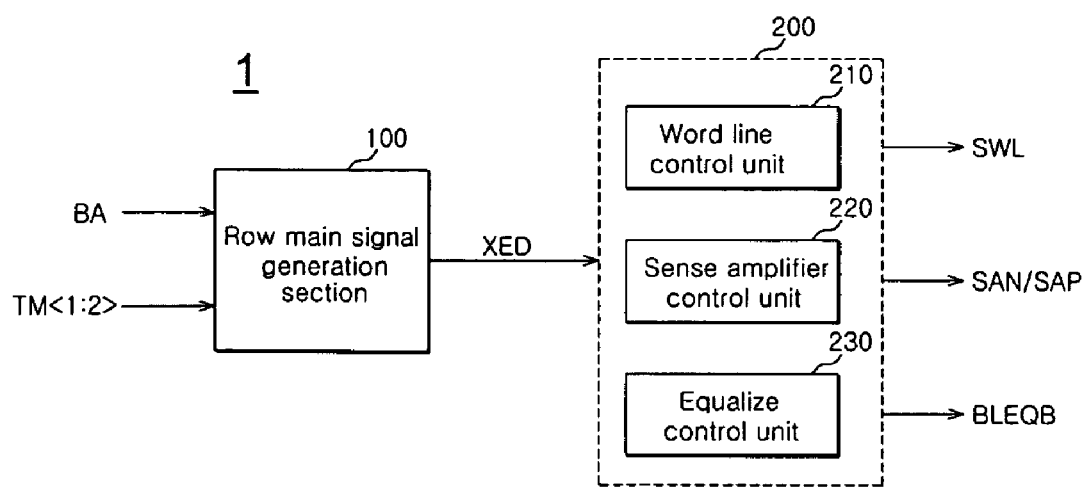
FIG. 1 is a schematic block diagram of an exemplary semiconductor integrated circuit according to one embodiment.

FIG. 1 is a schematic block diagram of an exemplary semiconductor integrated circuit 1 according to one embodiment. In FIG. 1, the semiconductor integrated circuit 1 can be configured to include a row main signal generation section 100 and a target circuit section 200.

The row main signal generation section 100 can receive a bank active signal 'BA' and test mode signals 'TM<1:2>', and can produce a row main signal 'XED'. Here, the row main signal 'XED' can be a main reference signal for driving row-series circuit units. For example, the row main signal generation section 100 can provide the row main signal 'XED' in response to the bank active signal 'BA', wherein the activation timing of the row main signal 'XED' can be controlled using the test mode signals 'TM<1:2>'. Accordingly, when it is necessary to tune the activation timing of the row main signal 'XED' in order to meet the timing specification for the target circuit section 200, a delay time can be increased or decreased using the externally applied test mode signals 'TM<1:2>' without the need of changing metal options of the conductive lines transmitting these various signals.

In FIG. 1, the target circuit section 200 can include a word line control unit 210, a sense amplifier control unit 220, and an equalize control unit 230. The target circuit section 200 can include a circuit section that can be controlled by the row main signal 'XED'. Alternatively, the target circuit section 200 can include additional circuit units. For example, the target circuit section 200 can include a row-series circuit section that can operate in response to a row-series command signal, i.e., an active command.

The word line control unit 210 can be configured to drive a corresponding sub-word line SWL in response to the row main signal 'XED'. Although not explicitly shown in the drawings, the word line control unit 210 can include an address decoder, a word line driver, and such. Accordingly, the word line control unit 210 can decode an address signal (not shown) in response to the row main signal 'XED'. The word line driver can drive the corresponding sub-word line SWL in response to the decoded address signal. Thus, the activation timing of the row main signal 'XED' can be related with the activation timing of the sub-word line SWL.

The sense amplifier control unit 220 can be configured to provide first and second sense amplifier control signals 'SAN' and 'SAP' associated with the driving of a corresponding sense amplifier, in response to the row main signal 'XED'. For example, if the row main signal 'XED' is activated, in response to the activation of the row main signal 'XED', then the sense amplifier control unit 220 can provide activated first and second sense amplifier control signals 'SAN' and 'SAP' such that the corresponding sense amplifier can prepare for sensing.

Similarly, the equalize control unit 230 can be configured to provide an inactivated bit line equalize signal 'BLEQB' in response to the row main signal 'XED' to release the equalized state of a precharged bit line. Accordingly, the activation timing of the row main signal 'XED' can be related with the inactivation timing of the bit line equalize signal 'BLEQB'.

As described above, the row main signal 'XED' can serve as a main reference signal for driving row-series circuit units. For example, in synchronism with the row main signal 'XED', the sub-word line SWL, the first and second sense amplifier control signals 'SAN' and 'SAP', and the bit line equalize signal 'BLEQB' can be activated or inactivated. Since these signals constitute asynchronous signal paths that may not be synchronous with a clock signal, it is important to control the activation timing of the row main signal 'XED'.

Figure 2:
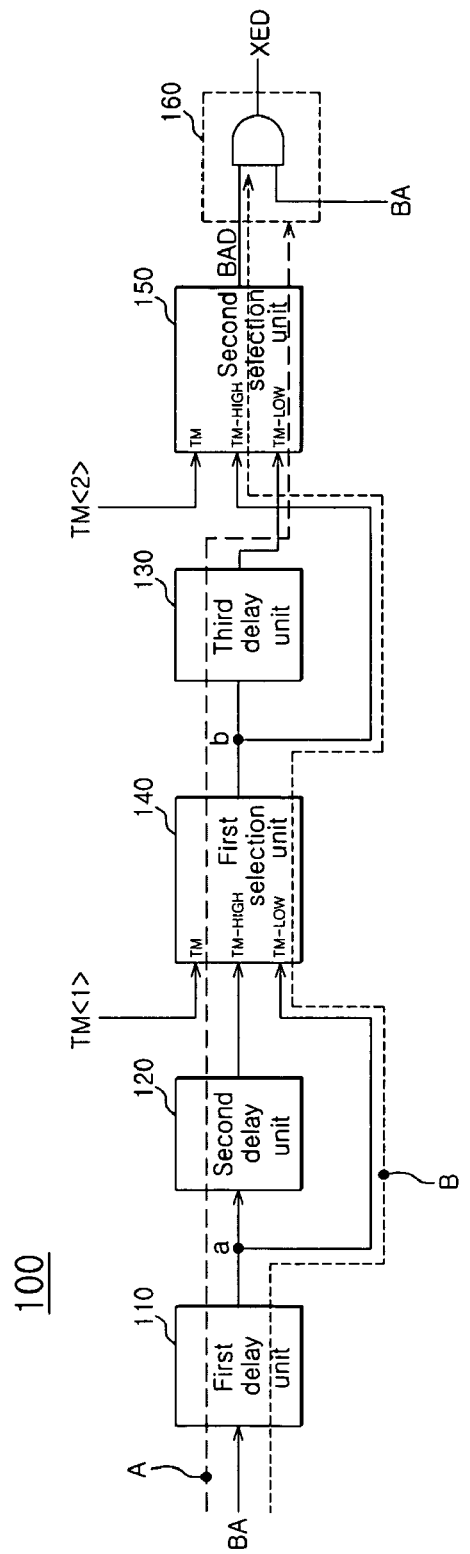
FIG. 2 is a schematic block diagram of an exemplary row main signal generation section capable of being implemented in the circuit of FIG. 1 according to one embodiment.
Figure 3:
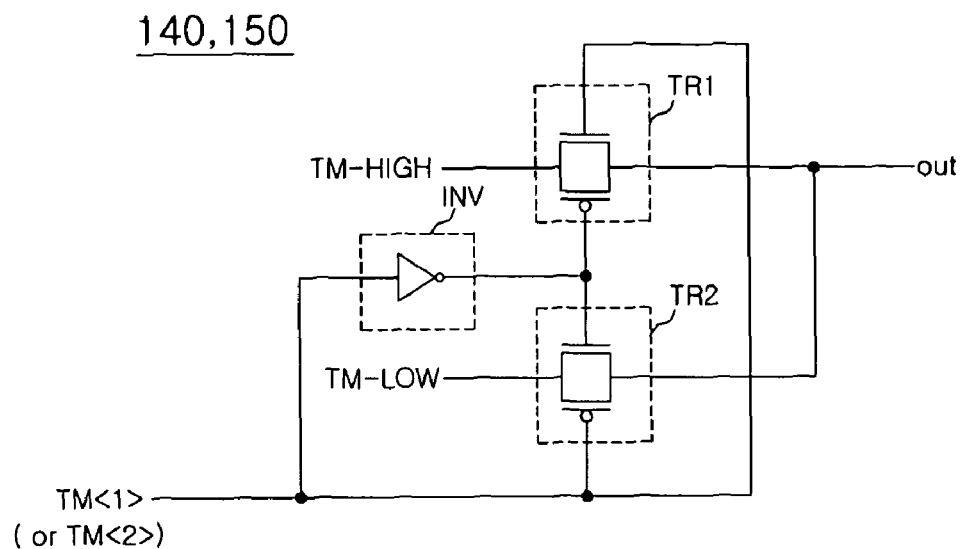
FIG. 3 is a schematic circuit diagram of exemplary first and second selection units capable of being implemented in the circuit of is FIG. 2 according to one embodiment.

FIG. 2 is a schematic block diagram of an exemplary row main signal generation section 100 capable of being implemented in the circuit of FIG. 1 according to one embodiment, and FIG. 3 is a schematic circuit diagram of exemplary first and second selection units 140 and 150 capable of being implemented in the circuit of FIG. 2 according to one embodiment. In FIGS. 2 and 3, the row main signal generation section 100 can include first, second, and third delay units 110, 120, and 130, first and second selection units 140 and 150, and a signal combining unit 160.

The row main signal generation section 100 can be configured to combine the bank active signal 'BA' and a delayed bank active signal 'BAD', and provide the row main signal 'XED'. Here, the bank active signal 'BA' can be a signal that is activated in response to an active command, and can be inactivated in response to a precharge command. In addition, the delayed bank active signal 'BAD' can be a signal that is generated by tuning the delay time of the bank active signal 'BA' in response to the test mode signals 'TM<1:2>'.

The row main signal generation section 100 can include the first, second, and third delay units 110, 120, and 130 and the first and second selection units 140 and 150 connected in series. Accordingly, the row main signal generation section 100 can output a signal having passed through at least one of the first, second, and third delay units 110, 120, and 130 or a signal from a node (a) or (b), having not passed through at least one of the first, second, and third delay units 110, 120, and 130, depending upon the test mode signals 'TM<1:2>' received in the first and second selection units 140 and 150.

Thus, the delay time of the delayed bank active signal 'BAD' can be tuned. As a result, the signal combining unit 160 can combine the bank active signal 'BA' and the delayed bank active signal 'BAD', and can output the row main signal 'XED'. In addition, the row main signal generation section 100 can tune the delay time of the activation timing of the row main signal 'XED'.

Although, in FIG. 2, the first selection unit 140 is located after the first and second delay units 110 and 120, and the second selection unit 150 is located after the third delay unit 130, the locations of the first and second selection units 140 and 150 may be changed.

In FIG. 2, the first, second, and third delay units 110, 120, and 130 can include delay units having a unit delay time. For example, each of the first, second, and third delay units 110, 120, and 130 can include delay elements, such as an inverter, a capacitor, and so forth.

The first delay unit 110 can be configured to receive the bank active signal 'BA' and provide a signal obtained by delaying the bank active signal 'BA' by a predetermined time to the node (a). The second delay unit 120 can be configured to receive the signal of the node (a) and provide a signal obtained by delaying the signal of the node (a) by the predetermined time to the first selection unit 140. The third delay unit 130 can be configured to receive the output signal of the first selection unit 140 and provide the output signal to the second selection unit 150.

The first and second selection units 140 and 150 can selectively provide signal transmission paths for a signal delayed in a preceding stage and a signal having not passed through a delay unit in a preceding stage, in response to the test mode signals 'TM<1>' and 'TM<2>' respectively received therein.

In FIG. 2, since the signal combining unit 160 can include an AND gate, the signal combining section 160 can provide the activated row main signal 'XED' only during an interval in which both of the delayed bank active signal 'BAD' and the bank active signal 'BA' are activated.

In FIG. 3, a first input terminal TM_HIGH of the first selection unit 140 can be supplied with the output signal of the second delay unit 120, and a second input terminal TM_LOW of the first selection unit 140 can be supplied with the signal of the node (a), which does not pass through the second delay unit 120. In addition, a first input terminal TM_HIGH of the second selection unit 150 can be supplied with the signal of the node (b), which does not pass through the third delay unit 130, and a second input terminal TM_LOW of the second selection unit 150 can be supplied with the output signal of the third delay unit 130.

In FIG. 2, the first selection unit 140 can selectively provide the signal having passed through one delay unit 110 or the signal having passed through two delay units 110 and 120. The second selection unit 150 can selectively provide the signal having passed through the first, second, and third delay units 110, 120, and 130, the signal having passed through the first delay unit 110, the signal having passed through the first and second delay units 110 and 120, via node (b), or the signal having passed through the first and third delay units 110 and 130, in the case of normal operation. However, the locations or the arrangement of selection units and delay units can be changed depending upon the specific configuration of a semiconductor integrated circuit or a control method thereof. In addition, even though the signals or control schemes input to the first and second input terminals TM_HIGH and TM_LOW of the second selection unit 150 can appear different from the signals or control schemes of the first selection unit 140 in that they interconnect the output signals of the preceding delay units, the number of selected delay units can be adjusted and a delay time can be tuned in a different manner by the first and second selection units 140 and 150.

In FIG. 3, the first and second selection units 140 and 150 can have substantially the same configurations. For example, only the supplied signals can be different from each other, wherein the operating principles of internal circuits of the first and second selection units 140 and 150 can be substantially the same with each other. Thus, for the sake of brevity, only the exemplary first selection unit 140 will be described.

The first selection unit 140 can include first and second transmission gates TR1 and TR2 and an inverter INV. Here, if the first transmission gate TR1 is turned ON in response to the first test mode signal 'TM<1>', the first selection unit 140 can transmit the signal of the first input terminal 'TM_HIGH'. In addition, if the second transmission gate TR2 is turned ON in response to the first test mode signal 'TM<1>', the first selection unit 140 can transmit the signal of the second input terminal 'TM_LOW'. For example, if the first test mode signal 'TM<1>' is activated to a high level, the first transmission gate TR1 can be turned ON to provide the signal of the first input terminal 'TM_HIGH' as an output signal. Conversely, if the first test mode signal 'TM<1>' is inactivated to a low level, the second transmission gate TR2 can be turned ON to provide the signal of the second input terminal 'TM_LOW' as an output signal.

An exemplary operation for tuning the activation timing of the row main signal 'XED' will be exemplified below with reference to FIG. 2.

For example, if a tRP specification is not met, i.e., if the level of a sub-word line that is activated by an active command after precharge, is unstable, then the activation timing of the sub-word line can be controlled to be delayed by delaying the activation timing of the row main signal (see the dotted line A). Accordingly, the test mode signals 'TM<1:2>' can be simply used while obviating the need of changing metal options of the conductive pathways. Thus, the first test mode signal 'TM<1>' can be activated, and the second test mode signal 'TM<2>' can be inactivated.

Accordingly, the first selection unit 140 can intercept the signal supplied through the second input terminal TM_LOW and provide the signal supplied through the first input terminal 'TM_HIGH to the node (b). For example, the signal having passed through both the first and second delay units 110 and 120 can be provided to the node (b). Thus, since the second test mode signal 'TM<2>' is inactivated, the signal of the node (b) supplied to the first input terminal TM_HIGH of the second selection unit 150 can be intercepted, and the output signal of the third delay unit 130 supplied to the second input terminal TM_LOW of the second selection unit 150 can be provided to the signal combining unit 160.

In FIG. 2, when both of the first and second selection units 140 and 150 are inactivated, i.e., during normal operation, the delayed bank active signal 'BAD' can be a signal that has passed through two delay units, i.e., the first and third delay units 110 and 130. Accordingly, if the tRP specification is not met, by activating the first test mode signal 'TM<1>', the delayed bank active signal 'BAD', which passes through one more delay unit than in the normal operation, can be generated. Thus, the activation timing of the sub-word line can be controlled to be delayed by delaying the activation timing of the row main signal 'XED'.

If a tRCD specification is not met, i.e., when a read command or a write command is not properly implemented after an active command, then the activation timing of the sub-word line can be controlled to be advanced by advancing the activation timing of the row main signal 'XED' (see the dotted line B). For example, the second test mode signal 'TM<2>' can be activated, and the first test mode signal 'TM<1>' can be inactivated. Accordingly, the first selection unit 140 can intercept the signal supplied through the first input terminal TM_HIGH and provide the signal of the node (a) supplied through the second input terminal 'TM_LOW' to the node (b). Here, the signal having passed through the first delay unit 110 can be provided to the node (b), and the signal of the node (b) can pass through the third delay unit 130. Since the second test mode signal 'TM<2>' is activated, the signal of the node (b) supplied through the first input terminal TM_HIGH of the second selection unit 150 can be transmitted, and the output signal of the third delay unit 130 supplied to the second input terminal TM_LOW of the second selection unit 150 can be intercepted. Thus, the signal of the node (b) having passed through one delay unit 110 can be provided to the signal combing unit 160.

If the tRCD specification is not met, by activating the second test mode signal 'TM<2>', the delayed bank active signal 'BAD', which passes one less delay unit than in the case of the normal operation, can be generated. Accordingly, the activation timing of the sub-word line can be controlled to be advanced by advancing the activation timing of the row main signal 'XED'.

Figure 4:
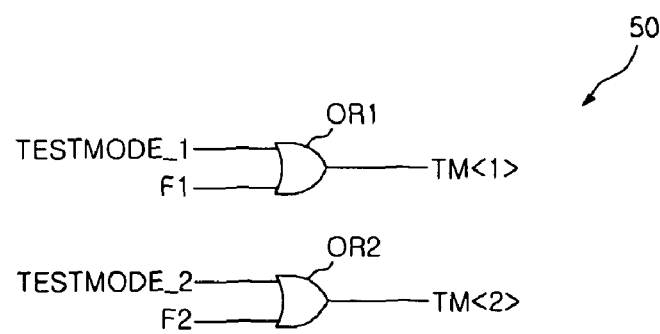
FIG. 4 is a schematic circuit diagram of an exemplary test mode circuit according to one embodiment.

FIG. 4 is a schematic circuit diagram of an exemplary test mode circuit according to one embodiment. In FIG. 4, a test mode circuit 50 can generate the test mode signals 'TM<1:2>' of FIG. 3. For example, the test mode circuit 50 can include first and second combining gates OR1 and OR2.

The first combining gate OR1 can logically OR a first test mode coding signal 'TESTMODE_1' and a first fuse signal 'F1', and can provide the first test mode signal 'TM<1>'. For example, the first test mode signal 'TM<1>' can be activated using the first test mode coding signal 'TESTMODE_1' as a test mode signal supplied from a mode register set (MRS). In addition, the first test mode signal 'TM<1>' can be activated by directly and physically fusing a fuse.

Similarly, the second combining gate OR2 can logically OR a second test mode coding signal 'TESTMODE_2' and a second fuse signal 'F2', and can provide the second test mode signal 'TM<2>'. By using substantially the same principle, the second test mode signal 'TM<2>' can be activated by using the MRS or the second fuse signal 'F2'.

Although the two test mode signals 'TM<1:2>' are exemplified for use, a plurality of test mode signals can be used. Accordingly, the test mode circuit 50 can also include a plurality of combining gates.

Figure 5:
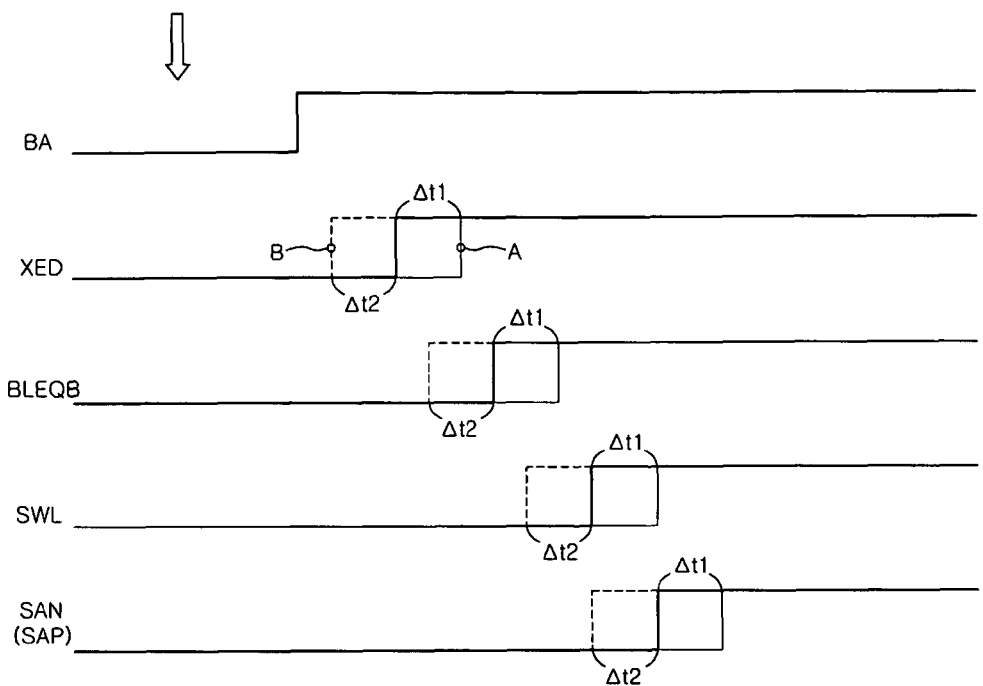
FIG. 5 is a schematic timing diagram of exemplary signals of FIG. 1.

FIG. 5 is a schematic timing diagram of exemplary signals of FIG. 1. In FIG. 5, the schematic timing diagram demonstrates the row-series signals that are activated in response to the row main signal 'XED'. In FIGS. 1-5, if the active command is activated, then the bank active signal 'BA' can be activated and, thus, the row main signal 'XED' can be activated.

In FIG. 5, a bit line equalize signal 'BLEQB' can be generated in response to the row main signal 'XED', and a sub-word line SWL and sense amplifier control signals 'SAN' and 'SAP' can be sequentially generated. If the tRP specification is not met, then the row main signal 'XED' can be activated by being delayed by a first predetermined delay time Ate when compared to the case of the normal operation (see A). The bit line equalize signal 'BLEQB', the sub-word line SWL, and the sense amplifier control signals 'SAN' and 'SAP' can also be generated by being delayed in response to the row main signal 'XED' that is delayed by the first delay time Δ t1.

However, if the tRCD specification is not met, then the row main signal 'XED' can be activated by being advanced by a second predetermined delay time Δt2 when compared to the case of the normal operation (see B). The bit line equalize signal 'BLEQB', the sub-word line SWL, and the sense amplifier control signals 'SAN' and 'SAP' can also be generated by being advanced in response to the row main signal 'XED' that is advanced by the second delay time 66 t2.

Although the first and second predetermined delay times Δt1 and Δt2 can be substantially the same delay time, other alternative timing configurations exist. By differently setting the times of the first, second, and third delay units 110, 120, and 130, the first predetermined delay time Δt1 and the second predetermined delay time Δt2 can be controlled to have different delay times. Accordingly, when the tRP or tRCD specification is not met, the activation timing of the row main signal 'XED' can be simply tuned using the test mode signals 'TM<1:2>' without the need of changing metal options of the conductive paths. Thus, it is possible to reduce production time loss and costs due to mask revisions. In addition, since it is possible to more flexibly tackle the failure analysis by using the test mode signals 'TM<1:2>', the manufacturing yield of a semiconductor integrated circuit can be increased.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A semiconductor integrated circuit, comprising:
   a row main signal generation section configured to provide a row main signal serving as a driving reference for a plurality of row-series circuit units in response to a bank active signal,
   wherein activation timing of the row main signal is controlled by a test mode signal, which is activated in accordance with whether an operating delay value of the plurality of row-side circuit units is within a predetermined delay range.

2. The semiconductor integrated circuit according to claim 1, wherein the row main signal generation section comprises:
   a first delay unit configured to receive and delay the bank active signal;
   a second delay unit configured to receive and delay an output signal of the first delay unit;
   a selection unit connected to the first and second delay units and configured to provide the delayed bank active signal by selectively transmitting the output signal of the first delay unit or an output signal of the second delay unit in response to the test mode signal; and
   a signal combining unit configured to combine the bank active signal and the delayed bank active signal, and to provide the row main signal.

3. The semiconductor integrated circuit according to claim 2, wherein the selection unit comprises:
   a first transmission gate configured to transmit the output signal of the second delay unit in response to the test mode signal; and
   a second transmission gate configured to transmit the output signal of the first delay unit in response to the test mode signal.

4. The semiconductor integrated circuit according to claim 3, wherein the first transmission gate is turned ON when the test mode signal is activated and provides the output signal of the second delay unit as the delayed bank active signal.

5. The semiconductor integrated circuit according to claim 3, wherein the second transmission gate is turned ON when the test mode signal is inactivated and provides the output signal of the first delay unit as the delayed bank active signal.

6. The semiconductor integrated circuit according to claim 1, wherein the test mode signal is activated by a test mode decoding signal supplied to an MRS or by a fused fuse.

7. A semiconductor integrated circuit, comprising:
   a row main signal generation section configured to provide a row main signal for determining precharge and active timing margins in response to an active command; and
   a target circuit section connected to the row main signal generation section and configured to generate a signal with reference to activation timing of the row main signal,
   wherein the row main signal is tuned in its delay time depending upon a test mode signal, which is activated in accordance with whether an operating delay value of the plurality of row-side circuit units is within a predetermined delay range.

8. The semiconductor integrated circuit according to claim 7, wherein the row main signal generation section comprises:
   a first delay unit configured to receive and delay a bank active signal when the active command is activated;
   a second delay unit configured to receive and delay an output signal of the first delay unit;
   a selection unit connected to the first and second delay units and configured to provide the delayed bank active signal by selectively transmitting one of the output signal of the first delay unit and an output signal of the second delay unit in response to the test mode signal; and
   a signal combining unit configured to combine the bank active signal and the delayed bank active signal, and to provide the row main signal.

9. The semiconductor integrated circuit according to claim 8, wherein the selection unit comprises:
   a first transmission gate configured to transmit the output signal of the second delay unit in response to the test mode signal; and
   a second transmission gate configured to transmit the output signal of the first delay unit in response to the test mode signal.

10. The semiconductor integrated circuit according to claim 9, wherein the first transmission gate is turned ON when the test mode signal is activated and provides the output signal of the second delay unit as the delayed bank active signal.

11. The semiconductor integrated circuit according to claim 10, wherein the second transmission gate is turned ON when the test mode signal is inactivated and provides the output signal of the first delay unit as the delayed bank active signal.

12. The semiconductor integrated circuit according to claim 7, wherein the target circuit section comprises:
    a word line control unit configured to provide a sub-word line in response to the row main signal;
    a sense amplifier control unit configured to provide a sense amplifier control signal in response to the row main signal; and
    an equalize control unit configured to provide a bit line equalize signal in response to the row main signal.

13. The semiconductor integrated circuit according to claim 7, wherein the test mode signal is activated by a test mode decoding signal applied to an MRS or by a fused fuse.

14. A semiconductor integrated circuit providing a driving reference signal for a plurality of row-series circuit units in response to a bank active signal, the semiconductor integrated circuit comprising:

a first delay unit configured to receive and delay the bank active signal;

a second delay unit configured to receive and delay an output signal of the first delay unit;

a first transmission gate configured to transmit the output signal of the second delay unit in response to a test mode signal; and a second transmission gate configured to transmit the output signal of the first delay unit in response to the test mode signal; and a signal combining unit configured to combine the bank active signal and the delayed bank active signal, and to provide the driving reference signal, wherein activation timing of the driving reference signal is controlled by the test mode signal.

15. The semiconductor integrated circuit according to claim 14, wherein the first transmission gate is turned ON when the test mode signal is activated and provides the output signal of the second delay unit as the delayed bank active signal.

16. The semiconductor integrated circuit according to claim 15, wherein the second transmission gate is turned ON when the test mode signal is inactivated and provides the output signal of the first delay unit as the delayed bank active signal.

17. The semiconductor integrated circuit according to claim 14, wherein the test mode signal is activated by a test mode decoding signal supplied to an MRS or by a fused fuse.

18. A method for generating a row main signal in a semiconductor integrated circuit comprising providing a row main signal serving as a driving reference for a plurality of row-series circuit units in response to a bank active signal, wherein the activation timing of the row main signal is controlled by a test mode signal, which is activated in accordance with whether an operating delay value of the plurality of row-side circuit units is within a predetermined delay range.

19. The method according to claim 18, further comprising:
receiving and delaying the bank active signal;
receiving and delaying an output signal of a first delay unit;
providing the delayed bank active signal by selectively transmitting the output signal of the first delay unit or an output signal of a second delay unit in response to the test mode signal; and
combining the bank active signal and the delayed bank active signal, and providing the row main signal.

20. The method according to claim 19, further comprising:
transmitting the output signal of the second delay unit in response to the test mode signal; and
transmitting the output signal of the first delay unit in response to the test mode signal.

21. The method according to claim 20 wherein a first transmission gate is turned on ON when the test mode signal is activated and further comprising providing the output signal of the second delay unit as the delayed bank active signal.

22. The method according to claim 20, wherein a second transmission gate is turned on ON when the test mode signal is deactivated and further comprising providing the output signal of the first delay unit as the delayed bank active signal.

23. The method according to claim 18, wherein the test mode signal is activated by a test mode decoding signal supplied to an MRS or by a fused fuse.

* * * * *